United States Patent
Hanawa et al.

[11] Patent Number: 5,951,724
[45] Date of Patent: Sep. 14, 1999

[54] FINE PARTICULATE POLISHING AGENT, METHOD FOR PRODUCING THE SAME AND METHOD FOR PRODUCING SEMICONDUCTOR DEVICES

[75] Inventors: Kenzo Hanawa; Naoyoshi Mochizuki; Naruo Ueda; Kazuhiko Kato, all of Saitama, Japan

[73] Assignee: Mitsui Mining and Smelting Co., Ltd., Tokyo, Japan

[21] Appl. No.: 09/030,803

[22] Filed: Feb. 26, 1998

[30] Foreign Application Priority Data

Apr. 25, 1997 [JP] Japan .................................. 9-108755

[51] Int. Cl.$^6$ .............................. C09G 1/02; C09K 3/14; C01R 17/00; H01L 21/309

[52] U.S. Cl. .................. 51/309; 51/307; 51/308; 438/693

[58] Field of Search ................... 106/3; 438/692, 438/693, FOR 119; 51/307, 308, 309

[56] References Cited

U.S. PATENT DOCUMENTS 5,543,126  8/1996  Ota et al. ............................. 423/263
5,766,279  6/1998  Ueda et al. ............................ 106/3

FOREIGN PATENT DOCUMENTS

| | | |
|---|---|---|
| 64-40267 | 2/1989 | Japan . |
| 8-134435 | 5/1996 | Japan . |
| 8-148455 | 6/1996 | Japan . |
| 9-082667 | 3/1997 | Japan . |
| 9-142840 | 6/1997 | Japan . |
| WO 93/22103 | 11/1993 | WIPO . |

*Primary Examiner*—Melissa Koslow
*Attorney, Agent, or Firm*—Young & Thompson

[57] ABSTRACT

A fine particulate polishing agent comprises fine particles of a solid solution composed of single-crystal ceric oxide and silicon dioxide and fine particles of silicon dioxide. A slurry polishing agent comprising the fine particulate polishing agent can be prepared by a method which comprises the steps of mixing, with stirring, single-crystal ceric oxide fine particles, silica sol and a liquid; drying the mixture; subjecting the dried particulate material to a thermal treatment at a high temperature and then cooling the solid solution powder formed by the thermal treatment and composed of single crystal ceric oxide and silicon dioxide; again mixing the powder with silica sol and a liquid; and then subjecting the mixture to deagglomeration using a wet pulverizing mill to give a slurry.

11 Claims, 1 Drawing Sheet

FINE PARTICULATE POLISHING AGENT, METHOD FOR PRODUCING THE SAME AND METHOD FOR PRODUCING SEMICONDUCTOR DEVICES

BACKGROUND OF THE INVENTION (a) Field of the Invention

The present invention relates to a fine particulate polishing agent comprising fine particles of a solid solution composed of single-crystal ceric oxide and silicon dioxide and fine particles of silicon dioxide; a stable slurry polishing agent comprising the fine particulate polishing agent; a method for producing the slurry polishing agent; and a method for producing a semiconductor device which makes use of the slurry polishing agent. More specifically, the present invention pertains to a fine particulate polishing agent and a slurry polishing agent which are suitable for use in various applications which require extremely high surface polishing accuracy, for instance, polishing of a variety of glass materials which comprise, as principal components, silicon dioxide, polishing of semiconductor materials such as silicon wafers and polishing of interlayer insulating films of silicon dioxide in semiconductor device-manufacturing processes, and which are suitably used for removing a superficial $SiO_2$ film through polishing while using an $Si_3N_4$ layer as a stopper for polishing since they have a high polishing rate for $SiO_2$ and they have a very low polishing rate for $Si_3N_4$ (i.e., a high selective polishing ratio of $SiO_2$ to $Si_3N_4$), as well as a method for producing these polishing agents and a method for producing semiconductor devices using the polishing agents.

(b) Description of the Prior Art

In the techniques wherein the surfaces of vitreous materials are polished to a mirror finish, in particular, those which should satisfy the requirement for extremely planar surface, the surface thereof has in general been polished using colloidal silica. Incidentally, the polishing with colloidal silica causes a problem of low polishing rate. Therefore, when a large amount of a material must be removed through polishing, the material is polished by a two-stage process. Firstly, it is polished with a polishing agent which mainly comprises ceric oxide and can ensure a high polishing rate and secondly, it is polished with colloidal silica, as disclosed in, for instance, Japanese Un-Examined Patent Publication No. Sho 64-40267. Such a two-stage polishing process requires the use of additional polishing installations and a superabundant time for switching over to the polishing with colloidal silica. This accordingly leads to a substantial reduction in the productibility.

There has been increasingly a demand for polishing techniques which can ensure surface planarity and therefore, it is very important to develop a novel polishing agent which supersedes colloidal silica, i.e., a polishing agent capable of achieving surface planarity comparable to or superior to that attained by the colloidal silica polishing agent and capable of ensuring a polishing rate comparable to that observed for the ceric oxide polishing agent.

The applicant of this invention has proposed, in Japanese Patent Application Serial No. Hei 6-272761, a polishing agent for use in semiconductor device-manufacturing processes, which comprises ceric oxide having an average particle size of not more than 0.1 $\mu$m. The fine particulate polishing agent can ensure a good polishing rate even if the particles thereof have a very small particle size on the order of not more than 0.1 $\mu$m, unlike the conventional ceric oxide polishing agents and the polishing rate is substantially higher than that achieved by using the silica polishing agents.

If quartz glass is polished with the polishing agent comprising ceric oxide particles having such a small particle size, the glass surface thus polished has a quite planar surface considerably superior to that achieved by the conventional ceric oxide polishing agents. Nevertheless, the polishing rate is found to be almost comparable to that achieved by the conventional ceric oxide polishing agents. More specifically, the use of ceric oxide fine particles ensures the polishing rate comparable to that observed for the conventional ceric oxide polishing agents, while ensuring the surface planarity approximately identical to that observed for the colloidal silica polishing agents.

However, the foregoing fine particulate polishing agent of ceric oxide causes the following problems. First, the ceric oxide particles show poor dispersibility in a medium (water) and this in turn makes it difficult to supply polishing agent fine particles uniformly to a polishing machine and a subject to be polished. Moreover, such a polishing agent shows high resistance which requires high torque to rotate the substrate. Therefore, the use thereof becomes a cause of various troubles of the subject when it has a small thickness and any increase in the polishing pressure during polishing cannot be admitted when the polishing machine used has poor rigidity.

On the other hand, when a polishing agent comprising colloidal silica is used, the polishing rate is quite susceptible to the pH value of the polishing liquid used and for this reason, the pH thereof should be maintained at a level of not less than 10 in order to ensure a polishing rate excellent in reproducibility. The polishing liquid having a pH of not less than 10 is very difficult for operators engaged in the polishing to handle the same and such a liquid is harmful to the operators.

Moreover, when a semiconductor device is produced using a multi layer interconnection circuit, the surface thereof must be processed into a predetermined shape. The polishing has widely been used as an effective technique for flattening or planarizing the surface of an insulating film. In particular, in the processing of semiconductor devices, there has been used the CMP (Chemical Mechanical Polishing) method as a surface-flattening method. In this CMP method, it has been known that the polishing rate is accelerated by the polishing effect through chemical reactions. In the polishing and surface-flattening processes used for manufacturing shallow trench isolation in semiconductor devices, a surface film is removed through polishing while using $Si_3N_4$ as a stopper for polishing, but this operation requires the use of a polishing agent which has a sufficiently high ratio of the surface film-polishing rate to the stopper-polishing rate (i.e., a high selective polishing ratio of the surface film to the stopper) or a polishing agent which can effectively remove the surface film, but can hardly remove the stopper.

SUMMARY OF THE INVENTION

Accordingly, it is, in general, an object of the present invention to provide a fine particulate polishing agent which can ensure a polishing rate comparable to that observed for the conventional ceric oxide polishing agents, while ensuring the surface planarity comparable to or superior to that achieved by the polishing with the colloidal silica polishing agents; which can ensure a polishing rate excellent in reproducibility even at a pH falling within the neutral range on the order of about 6 to 9; which has good dispersibility in a medium (water) and is stable therein; which requires low torque to rotate the substrate in processing; and which is suitably used for removing a superficial $SiO_2$ film through polishing while using an $Si_3N_4$ layer as a polishing stopper since they have a high polishing rate for $SiO_2$ to that for $Si_3N_4$ (i.e., a high selective polishing ratio of $SiO_2$ to $Si_3N_4$).

Another object of the present invention is to provide a stable polishing agent in the form of a slurry (slurry polishing agent), comprising, as a principal component, the foregoing fine particulate polishing agent.

Still another object of the present invention is to provide a method for preparing such a slurry polishing agent.

A further object of the present invention is to provide a method for producing a semiconductor device which makes use of the foregoing slurry polishing agent.

The inventors of this invention have conducted various studies to accomplish the foregoing objects of the present invention, and have found out that a combination of a fine particulate solid solution composed of single-crystal ceric oxide and silicon dioxide and fine particulate silicon dioxide can provide a desired polishing agent.

According to an aspect of the present invention, there is provided a fine particulate polishing agent comprising fine particles of a solid solution composed of single-crystal ceric oxide and silicon dioxide and fine particles of silicon dioxide.

According to another aspect of the present invention, there is provided a polishing agent in the form of a slurry, which comprises the foregoing fine particulate polishing agent dispersed in a medium such as water.

According to still another aspect of the present invention, there is provided a method for preparing the foregoing slurry polishing agent which comprises fine particles of the foregoing solid solution and fine particles of silicon dioxide. The method comprises the steps of mixing, with stirring, single-crystal ceric oxide fine particles, silica sol and a liquid; drying the resulting mixture; subjecting the dried particulate material to a thermal treatment at a high temperature; optionally pulverizing the thermally treated particle material; cooling the powdery solid solution thus formed by the thermal treatment or by the thermal treatment and the pulverization treatment; again mixing the powdery solid solution with silica sol and a liquid; and then subjecting the mixture to deagglomeration using a wet pulverizing mill to give a slurry.

According to still another aspect of the present invention, there is provided a method for producing a semiconductor device which comprises the step of polishing the surface of a substrate mainly comprising a silicon dioxide with the foregoing polishing agent.

DESCRIPTION OF THE PREFERRED EMBODIMENTS

Figure 1:
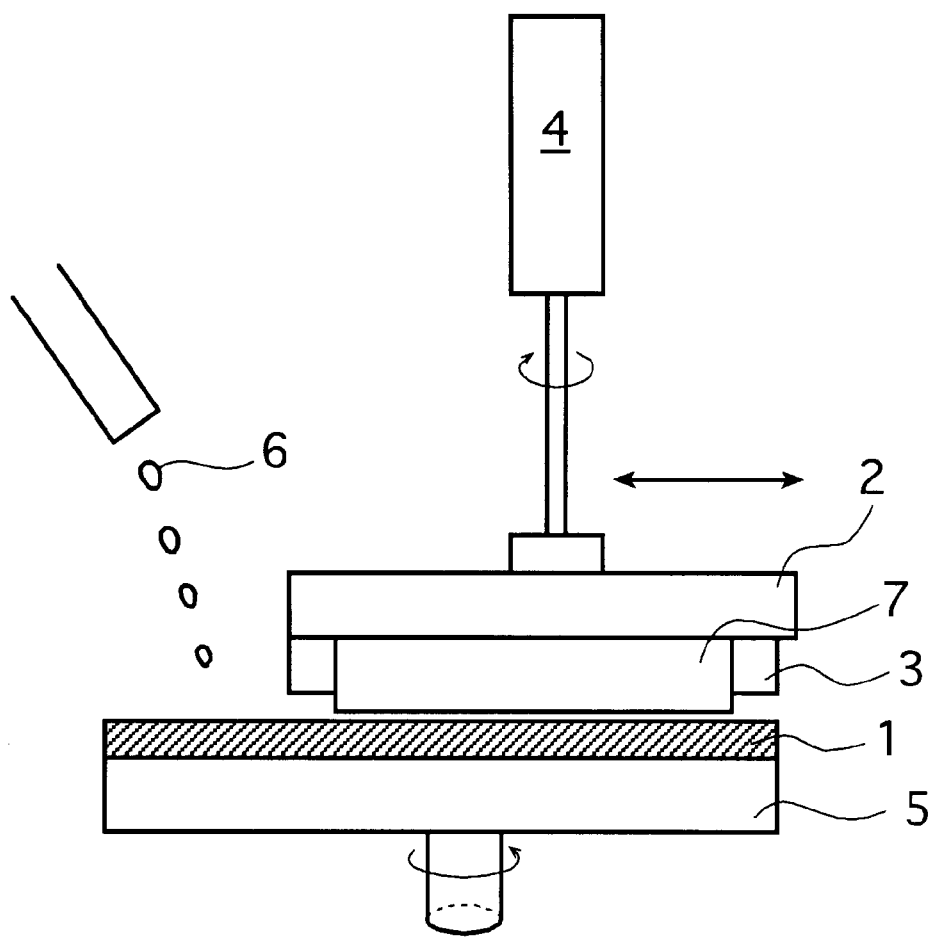
FIG. 1 is a schematic diagram showing the polishing machine used in Example 2.

The inventors of this invention have repeatedly conducted various investigations to achieve the foregoing objects. More specifically, colloidal silica and a slurry of $CeO_2$ fine particles are mixed with stirring using a stirring machine equipped with blades according to the disclosure of Japanese Examined Patent Publication No. Sho 53-6756 in which silica sol is mixed with a ceric oxide slurry in order to stabilize the polishing rate, but the inventors have failed to stably disperse the solid matter comprising $CeO_2$ in the liquid phase. However, it has been found that a stable slurry in which the solid matter is completely dispersed in the liquid phase can be obtained by drying such a stirred mixture, then subjecting the dried particulate material to a thermal treatment at a high temperature and further subjecting the thermally treated particulate material to deagglomeration using a wet pulverizing mill. Moreover, when observing the solid present in the stable slurry thus prepared with a transmission electron microscope (TEM) and subjecting it to energy dispersive X-ray (EDX) spectroscopic elemental analysis and X-ray diffractometry, it has been found that the solid is not a simple mixture, but a solid solution of $SiO_2$ and $CeO_2$. In addition, it has also been found that a major portion of the foregoing object is accomplished by the use of the polishing agent thus prepared. However, the resulting polishing agent was found to be insufficient in the ratio of the polishing rate for $SiO_2$ to that for $Si_3N_4$ (i.e., the selective polishing ratio of $SiO_2$ to $Si_3N_4$)

Under these circumstances, the inventors have conducted further investigations on the fine particulate polishing agent prepared by mixing, with stirring, single crystal ceric oxide fine particles, silica sol and a liquid; drying the mixture; subjecting the dried particulate material to a thermal treatment at a high temperature; mixing the powdery solid solution thus formed by the thermal treatment with silica sol; and then subjecting the mixture to deagglomeration using a wet pulverizing mill and have found out that the resulting polishing agent has a sufficiently high ratio of the polishing rate for $SiO_2$ to that for $Si_3N_4$ (i.e., a high selective polishing ratio of $SiO_2$ to $Si_3N_4$) within the neutral pH range of from about 6 to 9 and thus permits the achievement of all of the foregoing objects. The inventors of this invention have further conducted various investigations to establish conditions for treating $CeO_2$ with $SiO_2$, such as conditions for the reaction between single-crystal ceric oxide and silica sol and mixing ratio of the solid solution to the silica sol, which permit the formation of such solid solutions and the formation of a slurry free of any sedimentation even when allowing it to stand over a long time period.

As a result, it has been found that a stable slurry can be prepared by a method which comprises the steps of mixing, with stirring, single-crystal ceric oxide fine particles, silica sol and a liquid (such as water); drying the mixture; subjecting the dried powder to a thermal treatment at a high temperature to form the powdery solid solution composed of single-crystal ceric oxide and silicon dioxide; cooling the powdery solid solution thus formed by the thermal treatment; again mixing the powdery solid solution with silica sol and a liquid; and then subjecting the mixture to deagglomeration using a wet pulverizing mill. This thermal treatment at a high temperature permits the formation of a solid solution of $SiO_2$ and $CeO_2$ and hence a slurry in which the solid content is completely dispersed in the liquid.

It has been found that the foregoing slurry polishing agent in a highly dispersed state ensures a stable polishing rate even in the neutral pH range of from about 6 to 9 wherein the polishing rate is unstable when using the conventional colloidal silica and the polishing rate is found to be about 45% higher than that observed for the conventional ceric oxide polishing agents.

Polishing tests carried out using this slurry polishing agent indicate that the torque to rotate the substrate thereof is lower than that observed for the conventional fine particulate ceric oxide polishing agent and there is not observed any trouble such as any vibration of the polishing machine even if carrying out the polishing operation while a high load is applied thereto. In addition, the polishing agent has a sufficiently high selective polishing ratio of the polishing rate for $SiO_2$ to that for $Si_3N_4$ at a neutral pH region ranging from about 6 to 9.

The fine particulate polishing agents of the present invention present in the slurry polishing agents which are prepared by the foregoing methods comprise a solid solution of ceric oxide and silicon dioxide as will be proved in Examples given later.

Thus, the fine particulate polishing agent according to the present invention comprises of fine particles of a solid solution composed of single-crystal ceric oxide and silicon dioxide and fine particles of silicon dioxide.

In addition, the polishing agent in the form of a slurry according to the present invention comprises the foregoing fine particulate polishing agent dispersed in a medium.

Moreover, the method for preparing the foregoing slurry polishing agent according to the present invention comprises the steps of mixing, with stirring, single-crystal ceric oxide fine particles, silica sol and a liquid; drying the resulting mixture; subjecting the dried powdery material to a thermal treatment at a high temperature; optionally pulverizing the powdery material; cooling the powdery solid solution thus formed by the high temperature thermal treatment or the combination of the high temperature thermal treatment and the pulverization treatment; again mixing the powdery solid solution with silica sol and a liquid; and then subjecting the mixture to deagglomeration using a wet pulverizing mill to give a slurry.

Furthermore, the method for producing a semiconductor device according to the present invention comprises the step of flattening a semiconductor device through polishing while using the foregoing polishing agent. In particular, the method can be adopted when a superficial $SiO_2$ film is removed by polishing using the foregoing polishing agent and an $Si_3N_4$ film as a polishing stopper.

The fine particulate polishing agent of the present invention comprises fine particles of a solid solution composed of ceric oxide and silicon dioxide as well as fine particles of silicon dioxide. In this connection, a "fine particle of the solid solution of ceric oxide and silicon dioxide" herein used may be a particle essentially consisting of the solid solution or a particle which comprises the solid solution at least at the surface layer thereof, depending on the production conditions.

In the fine particulate polishing agent of the present invention, the weight ratio of the solid solution fine particles to the silicon dioxide fine particles preferably ranges from 100:0.5 to 100:15 and more preferably 100:2 to 100:8. This is because if the ratio is less than 100:0.5 (i.e., the relative amount of silicon dioxide fine particles is small), the intended effect of improving the ratio (selective polishing ratio) of the polishing rate for $SiO_2$ to that for $Si_3N_4$ cannot be expected, while if it is more than 100:15 (i.e., the relative amount of silicon dioxide fine particles is large), the resulting polishing agent tends to have a rather reduced polishing rate because of the inhibition of the polishing effect of the ceric oxide.

In the fine particulate polishing agent of the present invention, the weight ratio of ceric oxide to silicon dioxide present in the solid solution preferably ranges from 100:0.1 to 100:10. This is because if the ratio is less than 100:0.1 (i.e. the relative amount of silicon dioxide is small), the intended dispersion effect cannot be expected, while if it is more than 100:10 (i.e., the relative amount of silicon dioxide is large), the resulting polishing agent tends to have a reduced processing rate.

In the fine particulate polishing agent of the present invention, the average particle size of the solid solution fine particles preferably ranges from 0.01 to 0.5 $\mu$m, more preferably 0.01 to 0.2 $\mu$m and most preferably 0.01 to 0.1 $\mu$m, while taking into consideration the surface planarity achieved by the use of the polishing agent, the polishing rate and the dispersibility thereof in a medium (water). This is because if the average particle size thereof is less than 0.0 $\mu$m, the polishing agent has only a low polishing rate, while if it exceeds 0.5 $\mu$m, the surface planarity achieved by the polishing agent is rough.

In the fine particulate polishing agent of the present invention, the average particle size of the silicon dioxide fine particles is preferably smaller than that of the solid solution fine particles, in order to eliminate any formation of defects during polishing and is preferably not more than 0.5 $\mu$m, more preferably not more than 0.1 $\mu$m and most preferably not more than 0.03 $\mu$m. Such fine particulate silicon dioxide may be obtained by finely pulverizing fused silica, but may likewise be fumed silica obtained by spraying a gas of, for instance, silicon tetrachloride in a high temperature atmosphere; colloidal silica obtained by precipitated from water-glass; or colloidal silica obtained by decomposing an alkoxide of silicon with ammonia.

The single crystal ceric oxide fine particles used as a starting material in the method for producing the slurry polishing agent according to the present invention can be prepared by, for instance, mixing, with stirring, an aqueous solution of cerous nitrate and a base in such a mixing ratio that the pH of the resulting mixture falls within the range of from 5 to 10, then rapidly heating the mixture up to 70 to 100° C. and ripening it at that temperature. If the concentration of the aqueous cerous nitrate solution is extremely low, a desired production efficiency cannot be expected, but it is not restricted to any specific range so far as the production efficiency attained is not extremely impaired. Therefore, the upper limit of concentration may be almost equal to the upper limit of its solubility.

In the foregoing production method of the single crystal ceric oxide fine particles, any known base may be used without any restriction. However, if a hydroxide of an alkali metal or alkaline earth metal is used as such a base, the ceric oxide finally obtained would be contaminated with impurities consisting of the corresponding alkali metal or alkaline earth metal. Such an impurity-containing ceric oxi(d cannot be used in the semiconductor device-manufacturing processes as a polishing agent. Accordingly, an aqueous ammonia is preferably used to prepare ceric oxide single crystals completely free of such impurities.

An aqueous cerous nitrate solution and a base (preferably aqueous ammonia) are mixed, with stirring, in such a mixing ratio that the pH of the resulting mixture falls within the range of from 5 to 10. The pH of the resulting mixture is limited to 5 to 10 since the desired ceric oxide can be obtained by simply ripening the mixture having a pH falling within the range at a temperature ranging from 70 to 100° C. If the pH is less than 5, the cerous hydroxide is dissolved, while if it exceeds 10, the stability of cerous hydroxide increases and accordingly, the amount of ceric oxide produced is reduced. Accordingly, the pH value of the resulting mixture is adjusted to the range of from 5 to 10 and preferably 7 to 9 in the production method of the single crystal ceric oxide fine particles.

Subsequent to the mixing, with stirring, of the aqueous cerous nitrate solution and a base, the resulting mixture is rapidly heated up to a temperature ranging from 70 to 100° C. and ripened at that temperature. In this respect, if the mixed solution thus obtained is heated after allowing it to stand over a long time period, or if the heating thereof to a temperature ranging from 70 to 100° C. is carried out slowly, the yield of the resulting single-crystal ceric oxide fine particles is reduced or any desired single-crystal ceric oxide fine particles cannot be obtained. Therefore, the resulting mixture is preferably heated up to a temperature ranging from 70 to 100° C. within 10 minutes subsequent to the mixing step with stirring. This is because the use of a ripening temperature of less than 70° C. is not practicable since the ripening step requires a very long time Period, while the use of a ripening temperature of higher than 100° C. requires the use of an autoclave. Therefore, the ripening step should be carried out in the air while taking into consideration the economic factor and the resulting mixture is more preferably boiled under reflux at 1000° C. The desired ceric oxide can of course be prepared by heating the mixture at a temperature of higher than 100° C. using an autoclave, but ceric oxide particles thus prepared have a large particle size.

The ripening time may vary depending on the concentration of the cerium compound and the ripening temperature selected. More specifically, the higher the concentration thereof, the longer the ripening time and vice versa. In addition, the higher the ripening temperature, the shorter the ripening time and vice versa. In the production method of the single crystal ceric oxide fine particles, the ripening time preferably ranges from 0.2 to 20 hours and more preferably about 0.5 to 10 hours.

Cerium (III) hydroxide simultaneously undergoes dehydration and oxidation into cerium (IV) during the ripening step and the oxidation makes use of the oxygen atoms present in the aqueous solution and/or those originated from nitrate ions. The presence of cerium (IV) in the aqueous cerous nitrate solution is not accompanied by any trouble, but cerium (IV) forms $Ce(OH)_4$ which never undergoes dehydration even during the ripening step. Therefore, the amount of cerium (IV) mixed in is desirably not more than 5%.

Regarding the control of the particle size of the resulting ceric oxide, the particle size thereof varies depending on the mixing speed of the aqueous cerous nitrate solution and a base, preferably aqueous ammonia. If these two components are instantaneously admixed together by continuously introducing them in a small tank under high speed stirring conditions or a static mixer, the ceric oxide particles obtained after the ripening step has a small particle size on the order of 10 to 20 nm. On the other hand, if aqueous ammonia is gradually or slowly added to the aqueous cerous nitrate solution, the ceric oxide particles obtained after the ripening step has an increased particle size. For this reason, if ammonia is added to the aqueous solution in two stages while adjusting the amount thereof and the time required therefor, ceric oxide particles having a desired particle size can be prepared.

The cerous hydroxide is converted into single crystal ceric oxide and dispersed in the resulting slurry in the form of ultrafine particles at the time of the completion of the ripening step and therefore, the resulting slurry must not be calcined. Then nitrate ions and ions originated from the base component such as ammonium ions are removed from the slurry through washing. The means for washing the slurry may be repeated decantation, a repulping means, a rotary filter press which may be referred to as a continuous repulping apparatus or a fine particle-washing device which makes use of a ceramics filter, a hollow fiber membrane or an ultrafiltration membrane.

The silica sol used, as an ingredient, in the method for preparing the slurry polishing agent according to the invention is not restricted to specific one and may be any commercially available one.

Moreover, the liquid used in the invention is not likewise limited to any specific one and is in general water.

In the production method of the invention, the weight ratio: [ceric oxide fine particles plus silica sol (as expressed in terms of the solid content thereof)]/liquid preferably ranges from 0.2/100 to 20/100 and more Preferably 1/100 to 15/100 while taking into consideration, for instance, easiness of the operations for preparing the slurry polishing agent, the dispersion stability of the slurry and the polishing rate obtained by the slurry, as well as the surface planarity and the surface flatness of an article obtained after polishing with the slurry.

In the production method of the present invention, the processes for mixing with stirring, for drying and for deagglomeration with a wet pulverizing mill can be carried out by any means known to those skilled in the art.

The thermal treatment at a high temperature used in the production method of the present invention is carried out at a temperature preferably ranging from 150 to 1200° C. and more preferably 800 to 900° C. , while taking into consideration the reaction rate of the silica with ceric oxide and the production cost. If it is lower than 150° C., little effect is expected by the thermal treatment while the thermal treatment at a temperature higher than 1200° C. would result in strong agglomerations which can never be deagglomerated.

In the production method of the present invention, the mixture of the powdery solid solution, silica sol and a liquid may be obtained by a method in which the powdery solid solution, the silica sol and a liquid are mixed together in the form of slurries, a method in which a slurry of the solid solution, silica sol and liquid are mixed together in the form of slurries, or a method in which a slurry of the solid solution and silica solare mixed together in the form of surries. The solid solution powder may optionally be finely pulverized before or after mixing them.

The slurry polishing agent of the present invention prepared according to the foregoing production method may be used, as such, as a polishing agent. Alternatively, the slurry polishing agent may be, if desired, dried, optionally subjected to deagglomeration and may be redispersed in a medium (water) immediately before the practical use. If the slurry polishing agent is dried, the drying step is preferably carried out using a slurry dryer such as a vacuum dryer or a spray dryer so as not to cause strong agglomerations during the draying step The slurry polishing agent of the present invention has a neutral pH, good dispersibility in a medium (water) and good dispersion stability. If the slurry polishing agent as such is used for polishing quartz glass as a polishing agent, the slurry polishing agent ensures a polishing rate not less than 45% higher than that observed for the conventional fine particulate ceric oxide polishing agent, low torque to rotate the substrate to be polished and surface planarity at least comparable to that achieved by the use of colloidal silica.

The polishing agent of the present invention is suitable for use in the processes for flattening semiconductor devices through polishing and can ensure a high polishing rate for $SiO_2$ within the neutral pH region on the order of 6 to 9, while limiting the polishing rate for $Si_3N_4$ to a very low level, i.e., a high ratio of the polishing rate for $SiO_2$ to that for $Si_3N_4$ (a high selective polishing ratio of $SiO_2$ to $Si_3N_4$). Therefore, the slurry can suitably be used for removing superficial $SiO_2$ films through polishing while using an $Si_3N_4$ film or layer as a stopper for polishing. The polishing agent of the invention permits the achievement of the ratio of the polishing rate for $SiO_2$ to that for $Si_3N_4$, i.e., selective polishing ratio of $SiO_2$ to $Si_3N_4$, at a neutral pH ranging from about 6 to 9, usually on the order of not less than 20, preferably not less than 50 depending on the conditions for the production or not less than 100 which is observed under optimum conditions.

As has been discussed above in detail, the slurry polishing agent of the present invention can ensure the achievement of surface planarity comparable to or superior to that achieved by the colloidal silica polishing agents and a high polishing rate at least comparable to that achieved by the conventional ceric oxide polishing agents. Moreover, the slurry polishing agent of the present invention can ensure good reproducibility in the polishing rate observed at a neutral pH region on the order of about 6 to 9, has good dispersibility in a medium (water) and is stably dispersed in the medium and requires a low torque to rotate the substrate and a high ratio of the polishing rate for $SiO_2$ to that for $Si_3N_4$, i.e., selective polishing ratio of $SiO_2$ to $Si_3N_4$ at a neutral pH region on the order of about 6 to 9.

The present invention will hereinafter be described in more detail with reference to the following Examples, but the present invention is not restricted to these specific Examples.

EXAMPLE 1

There were separately prepared 20 liters of a 1 M aqueous cerous nitrate solution and 20 liters of a 3 M aqueous ammonia. These two solutions were simultaneously poured into a 60 l volume container followed by stirring with a stirring machine at 500 rpm. The pH value of the resulting mixed solution was found to be 9. After stirring the mixed solution for 5 minutes, steam was injected therein for 3 minutes to thus raise the temperature thereof to 100° C., followed by allowing it to stand at that temperature over one hour and then removal of nitrate ions and ammonium ions present therein through decantation repeated over 5 times to thus give a slurry containing ceric oxide particles.

The ceric oxide particle-containing slurry thus prepared was filtered and dried. The diameter of the resulting crystal grains was found to be 20 nm as determined on the basis of the peak width at half height. Moreover, the TEM micrograph of the particles indicates that they are composed of monodisperse particles whose sizes are uniform and having an average particle size of about 20 nm. These particles have a specific surface area of 23 $m^2/g$ and a particle size of about 20 nm as determined on the basis of the specific surface area. In addition, the ceric oxide particles were heated to determine its weight loss and it was found to be 1.3%. These results would indicate that each particle is a single crystal.

Then the following three components were mixed and sufficiently stirred in a stirring machine to give a slurry:

| | |
|---|---|
| Single crystal ceric oxide prepared by the foregoing method | 2 kg |
| Silica sol (average particle size of $SiO_2$: 20 nm; content of $SiO_2$: 20%) | 0.5 liter |
| Pure water | 2 liter |

The resulting slurry was dried in an oven whose temperature was set at 100° C. to remove the water from the slurry and to thus give powder. Thereafter, the powder was allowed to stand in an electric furnace maintained at 800° C. for 5 hours, followed by gradual cooling to give a powdery product. A small amount of the powder was mixed with pure water, the resulting mixture was dried on a microgrid to thus give a sample for transmission electron microscope. An electron beam was incident upon a region of about 3 nm Φ on a particle of this sample to analyze EDX and to thus quantify Ce and Si. As a result, each particle was found to be an $CeO_2$ particle containing 0.4 to 1.7% by weight of Si. Moreover, changes in the lattice constants were determined by the x-ray diffraction analysis and the lattice constant of the Si-containing $CeO_2$ was found to be smaller than that observed for $CeO_2$. In this connection, the ionic radius of the six-coordinate $Ce^{4+}$ is 0.80 Å and that of the six-coordinate $Si^{4+}$ is 0.40 Å. Accordingly, it is clear that Si is occluded in $CeO_2$ particles.

The powder prepared by the foregoing method was again dispersed in pure water to give a slurry, followed by addition of 0.4 liter of the foregoing silica sol and deagglomeration using a colloid mill to give a slurry polishing agent.

The resulting slurry polishing agent was inspected for the sedimentation behavior according to the following method. The slurry polishing agent was diluted with water to a solid content of 5% by weight, followed by dispensing one liter of the diluted slurry in a one liter volume graduated cylinder, sufficiently shaking it, then allowing it to stand, and taking 80 cc from the upper part after the lapse of each predetermined time to determine the solid content present therein. The results thus obtained are as follows:

| Elapsed Time | 0 | 30 min | 60 min | 1 day | 3 days | 5 days |
|---|---|---|---|---|---|---|
| Amount (wt %) | 5.0 | 5.0 | 5.0 | 4.9 | 4.5 | 4.3 |

EXAMPLE 2

The polishing was carried out using the slurry polishing agent prepared in Example 1 to determine the polishing rate ($\mu$m/min). In this respect, the pH value of the slurry was changed within the range of from 2 to 12 using hydrochloric acid or potassium hydroxide. The concentration of the slurry was set at 10% and the polishing was carried out using a polishing machine as set forth in FIG. 1. In FIG. 1, the reference numeral 1 represents a polishing pad; 2 a holder for a subject to be polished; 3 a tool for pressing the subject to the pad; 4 an air cylinder; 5 a surface plate for polishing; 6 a slurry polishing agent; and 7 a subject to be polished.
Subject to be polished: fused quartz (50×50×2 mm)
Polishing pad: SUBA 600 available from Rodale-Nitta
Pressure for polishing: 0.12 $Kg/cm^2$
Polishing time: 20 minutes The polishing was repeated 10 times at a pH value at which the polishing agent showed the highest polishing rate in order to confirm the ability of the polishing rate observed for the polishing agent.

In addition, pH values were determined at the beginning of the polishing operation and at an instance when the 10th polishing operation was completed. The results thus obtained are summarized in the following Table:

| Polishing Operation No. | Polishing Rate ($\mu$m/min) |
|---|---|
| 1 | 1.4 |
| 2 | 1.3 |
| 3 | 1.4 |
| 4 | 1.4 |
| 5 | 1.6 |
| 6 | 1.5 |

| Polishing Operation No. | Polishing Rate (μm/min) |
|---|---|
| 7 | 1.3 |
| 8 | 1.4 |
| 9 | 1.5 |
| 10 | 1.5 |
| Average | 1.4 |
| Initial pH Value | 7.5 |
| Final pH Value | 7.3 |

EXAMPLE 3

The same procedures used in Example 2 were repeated using the slurry polishing agent prepared in Example 1 except that MH Type polishing pad available from Rodale-Nitta was substituted for the polishing pad used in Example 2 and that the polishing pressure was adjusted to 0.4 Kg/cm². As a result, the torque to rotate the substrate was low enough that there was not observed any vibration of the polishing machine and the polishing rate was found to be high on the order of 2.8 μ m/min.

In this respect, the MH Type polishing pad available from Rodale-Nitta usually requires high torque to rotate the substrate when using a ceric oxide polishing agent. For this reason, it can be concluded that the polishing agent requires a torque to rotate the substrate lower than that required for the conventional ceric oxide.

EXAMPLE 4

Polishing operations were carried out under the polishing conditions specified in Example 2 using the slurry polishing agent prepared in Example 1 and then the surface planarity was determined using a surface roughness meter PC-10 available from Tencall . Japan Co., Ltd.

By way of comparison, polishing was carried out under the polishing conditions specified in Example 2 using colloidal silica: Compol EX available from Fujimi Incorporated Co., Ltd. at a solid content of 30% and then the surface planarity was likewise determined using the same device used above. The results thus obtained are as follows:

|  | Surface Roughness (Å) | |
|---|---|---|
|  | Ra | Rt |
| Slurry Polishing Agent of the Invention | 5 | 14 |
| Colloidal Silica Polishing Agent | 5 | 18 |

EXAMPLE 5

An insulating film comprising an $Si_3N_4$ film having a thickness of 10 nm was formed on the surface of a substrate composed of silicon and a shallow trench having a depth of 0.5 μm was formed on the substrate by etching. Then, $SiO_2$ layer having a thickness of 1.5 μm as measured from the bottom of the trench were formed by deposition using ache CVD method, on the surface of the substrate provided thereon with the $Si_3N_4$ film and the trench.

Then the surface of the substrate was polished using the slurry polishing agent prepared in Example 1 at a pH of about 7. The polishing was carried out under a polishing load of 0.15 Kg/cm². A surface plate for polishing and the polishing agent were maintained at room temperature. The relative moving speed of the substrate and the surface plate for polishing was set at about 30 m/min. The polishing was hardly proceed at an instance when the $Si_3N_4$ film was exposed and accordingly, the polishing was terminated. In this connection, the polishing rate of the polishing agent for $Si_3N_4$ was found to be less than 0.02 μm/min and that of the agent for $SiO_2$ was found to be not less than 1.0 μ m/min and thus the selective polishing ratio of $SiO_2$ to $Si_3N_4$ was not less than 50. This value is much greater than that observed for the conventional techniques wherein the selective polishing ratios of $SiO_2$ to $Si_3N_4$ accomplished are on the order of 1 to 5.

The reason why the polishing agent of the present invention is excellent in the ratio of polishing rates, i.e., the selective polishing ratio of $SiO_2$, to $Si_3N_4$ would be as follows. $SiO_2$ particles do not polish the $Si_3N_4$ film at all under a neutral pH on the order of 6 to 9 and are adhered to the surface thereof. On the other hand, the fine particles of the solid solution composed of single-crystal ceric oxide and silicon dioxide can slightly polish the $Si_3N_4$ film in the absence of $SiO_2$ particles, but may inhibit the polishing of the $Si_3N_4$ film when $SiO_2$ particles are, in advance, present on the surface of the film. For this reason, the fine particulate polishing agent of the present invention hardly scrapes away the $Si_3N_4$ film. In this respect, if the pH of the polishing agent: is beyond the range defined above, i.e., about 6 to 9, $SiO_2$ particles are hardly adhered to the surface of the $Si_3N_4$ film and therefore, the polishing of the $Si_3N_4$ film proceeds and this results in a reduction of the selective polishing ratio of $SiO_2$ to $Si_3N_4$.

What is claimed is:

1. A fine particulate polishing agent comprising fine particles of a solid solution composed of single-crystal ceric oxide and silicon dioxide and fine particles of silicon dioxide.

2. The fine particulate polishing agent of claim 1 wherein the weight ratio of the solid solution fine particles to the silicon dioxide fine particles ranges from 100:0.5 to 100:15.

3. The fine particulate polishing agent of claim 2 wherein the weight ratio of the solid solution fine particles to the silicon dioxide fine particles ranges from 100:2 to 100:8.

4. The fine particulate polishing agent of claim 1 wherein the weight ratio of ceric oxide to silicon dioxide present in the solid solution fine particles ranges from 100:0.1 to 100:10.

5. The fine particulate polishing agent of claim 1 wherein the solid solution line particles have an average particle size ranging from 0.01 to 0.5 μm and the silicon dioxide fine particles have an average particle size of not more than 0.5 μm.

6. The fine particulate polishing agent of claim 5 wherein the solid solution fine particles have an average particle size ranging from 0.01 to 0.2 μm and the silicon dioxide fine particles have an average particle size of not more than 0.1 μm.

7. A slurry polishing agent comprising the fine particulate polishing agent as set forth in claim 1.

8. A method for preparing a slurry polishing agent which comprises fine particles of a solid solution composed of single-crystal ceric oxide and silicon dioxide and fine particles of silicon dioxide, comprising the steps of mixing, with stirring, single-crystal ceric oxide fine particles, silica sol and a liquid; drying the mixture; subjecting the dried particulate material to a thermal treatment at a high temperature and then cooling the powdery solid solution formed by the thermal treatment and composed of single-crystal ceric oxide and silicon dioxide; again mixing the powder with silica sol and a liquid; and then subjecting the mixture to deagglomeration using a wet pulverizing mill to give a slurry.

9. A method for producing a semiconductor device comprising the step of flattening through polishing with the fine particulate polishing agent as set forth in claim 1.

10. A method for producing a semiconductor device comprising the step of removing an $SiO_2$ film on the surface through polishing using an $Si_3N_4$ film as a polishing stopper and the fine particulate polishing agent as set forth in claim 1 as a polishing agent.

11. The method for producing a semiconductor device according to claim 10 wherein the fine particulate polishing agent is used at a pH ranging from 6 to 9.

* * * * *